US011032914B2

(12) United States Patent
Matejat et al.

(10) Patent No.: US 11,032,914 B2
(45) Date of Patent: Jun. 8, 2021

(54) METHOD OF FORMING A SOLDERABLE SOLDER DEPOSIT ON A CONTACT PAD

(71) Applicant: Atotech Deutschland GmbH, Berlin (DE)

(72) Inventors: Kai-Jens Matejat, Berlin (DE); Sven Lamprecht, Berlin (DE); Jan Sperling, Berlin (DE); Christian Ohde, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 16/466,817

(22) PCT Filed: Dec. 22, 2017

(86) PCT No.: PCT/EP2017/084320
§ 371 (c)(1),
(2) Date: Jun. 5, 2019

(87) PCT Pub. No.: WO2018/115408
PCT Pub. Date: Jun. 28, 2018

(65) Prior Publication Data
US 2019/0350088 A1 Nov. 14, 2019

(30) Foreign Application Priority Data
Dec. 23, 2016 (EP) .................... 16206665

(51) Int. Cl.
*C25D 5/54* (2006.01)
*H05K 3/34* (2006.01)
(Continued)

(52) U.S. Cl.
CPC ............. *H05K 3/3473* (2013.01); *C25D 5/54* (2013.01); *C25D 7/00* (2013.01); *H05K 1/111* (2013.01);
(Continued)

(58) Field of Classification Search
None
See application file for complete search history.

(56) References Cited

U.S. PATENT DOCUMENTS 5,503,877 A 4/1996 Stamp et al.
5,543,182 A 8/1996 Joshi et al.
(Continued)

FOREIGN PATENT DOCUMENTS

CN 103053228 4/2013
EP 1322146 6/2003
(Continued)

OTHER PUBLICATIONS

Mohanty et al.,"Effect of pyridine and picolines on the electrocrystallisation of nickel from sulphate solutions", Surface & Coatings Technology, 197, 2005, 247-252 (Year: 2005).*
(Continued)

*Primary Examiner* — Stefanie S Wittenberg
(74) *Attorney, Agent, or Firm* — Renner, Otto, Boisselle & Sklar, LLP

(57) ABSTRACT

A method of forming a solderable solder deposit on a contact pad, comprising the steps of providing an organic, non-conductive substrate which exposes said contact pad under an opening of a first non-conductive resist layer, depositing a conductive layer inside and outside the opening such that an activated surface results, thereby forming an activated opening, electrolytically depositing nickel or nickel alloy into the activated opening such that nickel/nickel alloy is deposited onto the activated surface, electrolytically depositing tin or tin alloy onto the nickel/nickel alloy, with the proviso that the electrolytic deposition of later steps results in an entirely filled activated opening, wherein the entirely filled activated opening is completely filled with said nickel/nickel alloy, or in the entirely filled activated opening the total volume of nickel/nickel alloy is higher than the total (Continued)

Figure 1A:
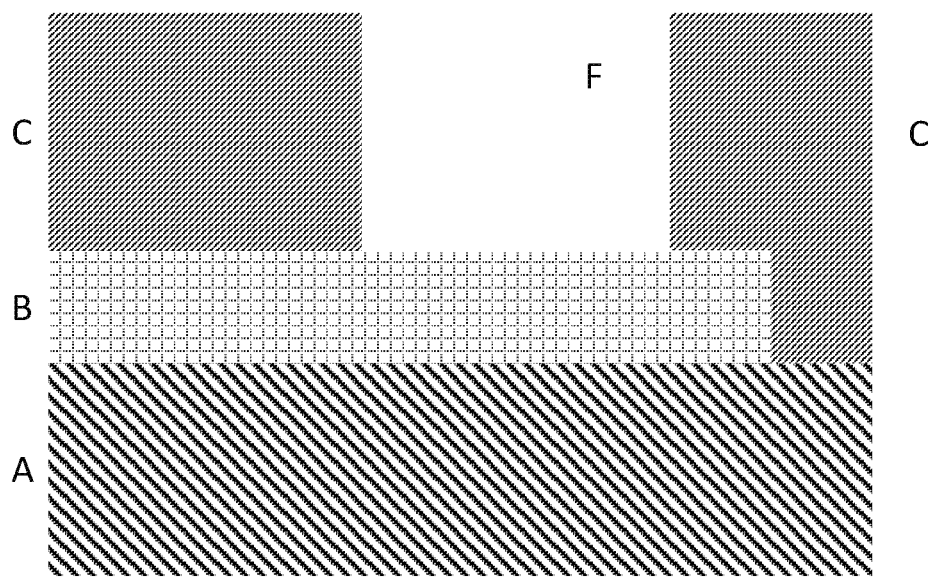

volume of tin and tin alloy, based on the total volume of the entirely filled activated opening.

17 Claims, 7 Drawing Sheets

(51) Int. Cl.
    *C25D 7/00*     (2006.01)
    *H05K 1/11*     (2006.01)
    *H05K 3/10*     (2006.01)
    *H05K 3/24*     (2006.01)

(52) U.S. Cl.
    CPC ............. *H05K 3/108* (2013.01); *H05K 3/244* (2013.01); *H05K 2201/0347* (2013.01); *H05K 2203/0571* (2013.01); *H05K 2203/0723* (2013.01)

(56) References Cited

U.S. PATENT DOCUMENTS

| | | | |
|---|---|---|---|
| 5,693,209 A | 12/1997 | Bressel et al. | |
| 8,497,200 B2 | 7/2013 | Matejat et al. | |
| 8,507,376 B2 | 8/2013 | Ewert et al. | |
| 9,357,644 B2 | 5/2016 | Takagi | |
| 2006/0043158 A1 | 3/2006 | Wang | |
| 2006/0070885 A1* | 4/2006 | Uzoh | H01L 21/76871 |
| | | | 205/122 |
| 2006/0219567 A1 | 10/2006 | Hu | |
| 2007/0161223 A1 | 7/2007 | Hu et al. | |
| 2007/0278673 A1 | 12/2007 | Shih-Ping et al. | |
| 2009/0188805 A1* | 7/2009 | Moffat | C25D 3/20 |
| | | | 205/119 |
| 2013/0105329 A1 | 5/2013 | Matejat et al. | |

FOREIGN PATENT DOCUMENTS

| | | |
|---|---|---|
| TW | 518924 | 1/2003 |
| TW | 201433220 | 8/2014 |
| WO | 2016047181 | 3/2016 |
| WO | 2016180944 | 11/2016 |

OTHER PUBLICATIONS

Jung et al. "Characteristics of Sn—Cu Solder Bump Formed by Electroplating for Flip Chip" IEEE Transactions on Electronics Packaging Manufacturing, vol. 29, No. 1, 2006 (Year: 2006).*
PCT/EP2017/084320; PCT International Search Report and Written Opinion of the International Searching Authority dated Mar. 22, 2018.
Search Report for Taiwanese Patent Application No. 106145331 dated Jul. 29, 2019.

* cited by examiner

METHOD OF FORMING A SOLDERABLE SOLDER DEPOSIT ON A CONTACT PAD

The present application is a U.S. National Stage Application based on and claiming benefit and priority under 35 U.S.C. § 371 of International Application No. PCT/EP2017/084320, filed 22 Dec. 2017, which in turn claims benefit of and priority to European Application No. 16206665.8 filed 23 Dec. 2016, the entirety of both of which is hereby incorporated herein by reference.

The present invention relates to (i) a method of forming a solderable solder deposit on a contact pad and (ii) a printed circuit board exposing on an activated contact pad a solderable solder deposit.

In present electronic products a high number of electronic components are accommodated. In order to further increase performance of such products performance of said components needs to be increased, too.

Therefore, packaging in electronic components is more and more improved to increase performance in said components and finally in said electronic products. Typically, electronic components are more and more miniaturized as a result of small integrated circuit areas, high packing density, and multiple pins, such as Ball Grid Arrays (BGA), flip chips or Multi Chip Modules (MCM).

For example, flip chip technology (also called Controlled Collapse Chip Connection, C4) was introduced by IBM in 1964 to efficiently interconnect chip pads of a chip (e.g. an Integrated Circuit, IC) with respective pads of a circuitry (e.g. of a circuit board or another chip). These pads are also often called contact areas. Interconnection is usually achieved via melted/soldered solder deposits (also called solder balls or solder joints) that have been deposited between the pads of the chip and the pads of the circuitry, or other conductive adhesive materials located instead between the chip and the circuitry. An organic resin (also called underfill or underfilling) may be further dispensed in between thereby filling the gap between the chip and the circuitry, constraining the thermal mismatch and lowering the mechanical stress on the melted solder deposits. This "face to face" package provides a tight interconnection and a high packing density, wherein no wire bonding is required. A further advantage is a better electrical performance, such as a low inductance.

Prior to interconnecting, solderable solder deposits are typically formed onto the pads of the chip or on the pads of both. If solder deposits are formed onto the pads of the circuitry (e.g. of a circuit board), usually low-temperature solder deposits are used. Typically, solder deposits contain tin, copper, gold, and mixtures thereof as a solderable metal; low-temperature solder deposits in particular contain tin or tin alloys.

During interconnection and while the respective pads with their solder deposits in between face each other, the solder deposits are melted by typically utilizing hot air at a reflow temperature such that a uniform electric connection (a melted/soldered solder deposit) is formed between the two respective pads. For better soldering a soldering flux is typically applied prior to melting.

In modern application, the circuitry is usually provided on a circuit board, such as a printed circuit board. Such a board comprises the circuitry (usually a copper circuitry), which is printed onto a non-conductive organic substrate. Circuitries on organic, non-conductive substrates are cost efficient and can be quickly produced.

In the chip, the chip pads (usually copper pads) are also provided onto a non-conductive substrate, typically a semiconductor material, such as silicon.

In the past, solderable solder deposits were formed by printing (e.g. stencil printing). However, printing methods typically reach its limits if the distance (pitch; distance between the center of an opening to the center of an adjacent opening) between solderable deposits is 150 µm or below. Furthermore, binding strength between the pad and the solder deposit becomes weaker with decreasing solder deposit dimensions.

In order to overcome this drawback, solderable solder deposits are electrolytically formed in modern day applications. Compared to printing methods, the electrolytic deposition usually takes place with higher accuracy and meets the requirements of fine routing. As a result, high-density circuitries with a reduced circuit board area can be implemented.

Electrolytic deposition of solderable solder deposits usually starts with forming a conductive layer (also called seed layer) by for example electroless methods such as electroless copper deposition. Afterwards, metals for the solderable solder deposit are sequentially formed onto the conductive layer by electrolytic metal deposition.

WO 2012/016932 A1 relates to a method to form solder deposits and non-melting bump structures on substrates. The method discloses at least one contact area (101), at least one contact area opening (105) with a first conductive seed layer (106) and an electroplated metal or metal alloy layer (107) deposited onto the first conductive seed layer. The electroplated metal or metal alloy is selected from the group consisting of tin, copper, tin alloys and copper alloys. According to one embodiment, a first barrier layer is plated on the at least one contact area, wherein the barrier layer consists of a metal or alloy selected from the group consisting of nickel, tin, chromium, titanium, silver, gold, palladium, alloys thereof and multilayers thereof. The first barrier layer is deposited underneath the first conductive seed layer.

Furthermore, WO'932 discloses in FIG. 6c a barrier layer (115) on top of the metal or metal alloy layer (107). The barrier layer (115) can be an adhesive layer of nickel, nickel alloys and/or a protective layer of gold. Said barrier layer (115) may also be made of nickel, chromium, titanium, silver, gold, palladium, alloys thereof and multi layers thereof which can be made by electroless plating, physical vapor deposition or chemical vapor deposition.

WO 2010/046235 A1 relates to the formation of solder deposits by electroplating, particularly to flip chip packages, more particularly to flip chip joints and board to board solder joints formed by electroplated solder of tin and tin alloys. Similar to WO'932, WO'235 discloses a nickel barrier layer directly on top of the contact area.

WO 2012/004136 A2 relates to the formation of solder alloy deposits by electroplating and to solder joints between e.g., IC substrates and active components. WO'136 discloses a substrate including a surface bearing electrical circuitry that includes at least one contact area, a solder mask exposing the at least one contact area, a metal seed layer, a resist layer, a first solder material consisting of pure tin, and a second solder material layer consisting of a tin-silver alloy. Optionally a nickel barrier layer is directly formed on the contact area.

US 2006/0219567 A1 relates to fabrication methods for conductive bump structures of circuit boards. US'567 discloses a plurality of electrically connecting pads formed on at least one surface of a circuit board, an insulating protection layer having a plurality of openings to expose the electrically connecting pads, a conductive layer on surfaces of the insulating protection layer and openings thereof, and a metal layer on the conductive layer, the metal layer electrolytically deposited. The conductive layer can be nickel. The metal layer can be made of Pb, Sn, Ag, Cu or an alloy thereof, preferably the metal layer is made of copper.

EP 1 322 146 A1 relates to the electronic packages, particularly to flip chip packages, more particularly to flip chip joints and board to board solder joints formed by electroplated solder on the organic circuit boards. EP'146 discloses an organic board, at least one contact pad, a solder mask exposing the contact pad, a thin metal layer deposited over said board, a resist layer with at least one opening located at said pad, and a solder material formed in said opening by electroplating. The thin metal layer can be tin. The solder metal is an alloy made by the mixture of the elements selected from the group consisting of lead, tin, silver, copper, bismuth, antimony, zinc, nickel, aluminum, magnesium, indium, tellurium, and gallium. In EP'146, FIG. 3C a barrier layer is disclosed which can be nickel.

US 2007/0161223 A1 discloses a fabrication method including providing a circuit board with a plurality of first, second and third electrically conductive pads; forming first and second conductive layers on the circuit board; forming first and second resist layers respectively on the first and second conductive layers, the resist layers having a plurality of openings for exposing the conductive layers on the pads; forming a metal layer in the openings of the first and second resist layers; and forming a first connecting layer on the metal layer.

US 2006/0043158 A1 discloses a method for fabricating electrical connections of a circuit board. The circuit board has a plurality of electrical connection pads thereon. A protective layer is applied on the circuit board and has a plurality of openings for exposing the electrical connection pads. A conductive layer is formed on the protective layer and the electrical connection pads. A resist layer is applied on the conductive layer and has a set of openings for exposing a portion of the conductive layer covering some of the electrical connection pads. A first metal layer is electroplated in the openings of the resist layer. Another set of openings are formed through the resist layer corresponding to the rest of the electrical connection pads. A second metal layer is electroplated on the first metal layer and above the rest of the electrical connection pads to form different electrical connections on the circuit board.

US 2007/0278673 A1 relates to a repaired structure of a circuit board having pre-soldering bumps and a method for repairing the same, and more particularly, to a method for repairing a defective pre-soldering bump by a micro-electrode.

Despite several advantages over printing methods, electrolytic deposition of solderable solder deposits also meets challenges. Existing electrolytic deposition methods need to be adapted to more and more miniaturized pad sizes. Respective methods need to be simple and reliable. Despite decreasing pad sizes an acceptable binding strength between pad and solder deposit needs to be maintained.

Furthermore, copper ion migration from a copper pad through the solderable solder deposit to the outer surface of the deposit needs to be sufficiently suppressed. In case of tin containing solder deposits an undesired formation of a copper tin alloy is observed in many cases. Such a formation negatively affects the efficacy of typically applied soldering fluxes, often resulting in an undesired void formation inside the solderable solder deposits.

In addition, copper is typically used in or as a conductive layer on non-conductive resist layers in order to carry out subsequent electrolytic metal deposition. As mentioned above, decreasing pad sizes are more and more common today. As a consequence thereof, copper in conductive layers becomes more and more a problem in terms of migrating into the solder deposit. Since solder deposits are getting smaller and smaller, too, even small amounts of copper in a comparatively thin conductive layer cause undesired copper ion infiltration into solder deposits. This becomes even more problematic if the very small solder deposit almost entirely consists of tin.

Furthermore, a solder deposit, which almost entirely consists of tin, often exhibits a tendency to easily distort upon pressure and/or heat. Our own experiments have shown that in such cases an insufficient internal stiffness of the entire solder deposit was observed. Furthermore, upon heat and/or pressure an almost pure-tin-solder deposit easily loses dimensional stability. As a result, upon heat and/or pressure a solder deposit could get into contact with an adjacent solder deposit thereby causing a short circuit. This is in particular problematic, if the pitch between two adjacent solder deposits is 40 µm or less.

In solder deposits, which almost entirely consist of tin, tin is usually deposited non-conformally. This means that tin is electrolytically deposited above a pad, wherein the utilized deposition bath usually contains leveler compounds. Our own experiments have shown that such an electrolytic deposition can be sufficiently carried out for pure tin solder deposits. However, our own experiments have also shown that a non-conformal, electrolytic deposition of tin alloys is very often only insufficiently achieved, typically resulting in inclusions within the solder deposit, leading itself to void formation during subsequent reflow. In many cases this drawback is overcome by first non-conformally depositing pure tin and subsequently depositing the desired tin alloy. However, this includes an additional process step, which is not desired.

It was therefore the objective of the present invention to provide an improved method of forming a solderable solder deposit on a contact pad, in particular to provide a method, which can be used for forming small size solder deposits, in particular for forming solder deposits exhibiting a diameter of 50 µm or less, in particular 30 µm or less, and significantly prevents copper ion migration from a copper containing conductive layer into the solder deposit, such that copper containing conductive layers with a comparatively high layer thickness can be still used, provides at the same time increased dimensional stability upon heat and/or pressure and increased internal stiffness, and optionally allows electrolytic deposition of a tin alloy as a finish directly on nickel or nickel alloy without the need of a pure tin deposit between nickel/nickel alloy and tin alloy, and provides sufficient binding strength between pad and solder deposit.

The above mentioned objective is solved by a method of forming a solderable solder deposit on a contact pad B, comprising the steps of
(i) providing or manufacturing an organic, non-conductive substrate A which exposes said contact pad under an opening F of a first non-conductive resist layer C,
(ii) depositing a conductive layer G inside G″ and outside G′ the opening such that an activated surface results, thereby forming an activated opening F′, (iii) electrolytically depositing nickel D or a nickel alloy D into the activated opening such that nickel/nickel alloy is deposited onto the activated surface, (iv) electrolytically depositing tin E or a tin alloy E onto the nickel/nickel alloy deposited in step (iii), with the proviso that the electrolytic deposition of steps (iii) or (iv) results in an entirely filled activated opening, wherein the entirely filled activated opening is completely filled with said nickel/nickel alloy, or in the entirely filled activated opening the total volume of nickel/nickel alloy is higher than the total volume of tin and tin alloy, based on the total volume of the entirely filled activated opening.

In the method of the present invention "solderable solder deposit" denotes a distinct stack of metal layers prior to a melting, reflow or soldering step.

Figure 1B:
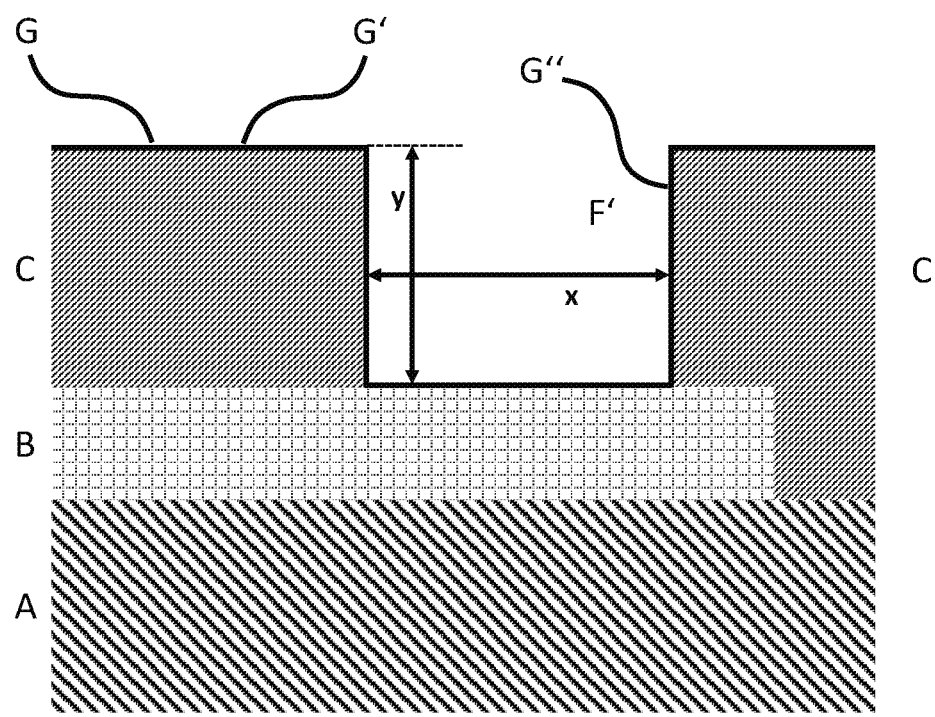
Figure 1C:
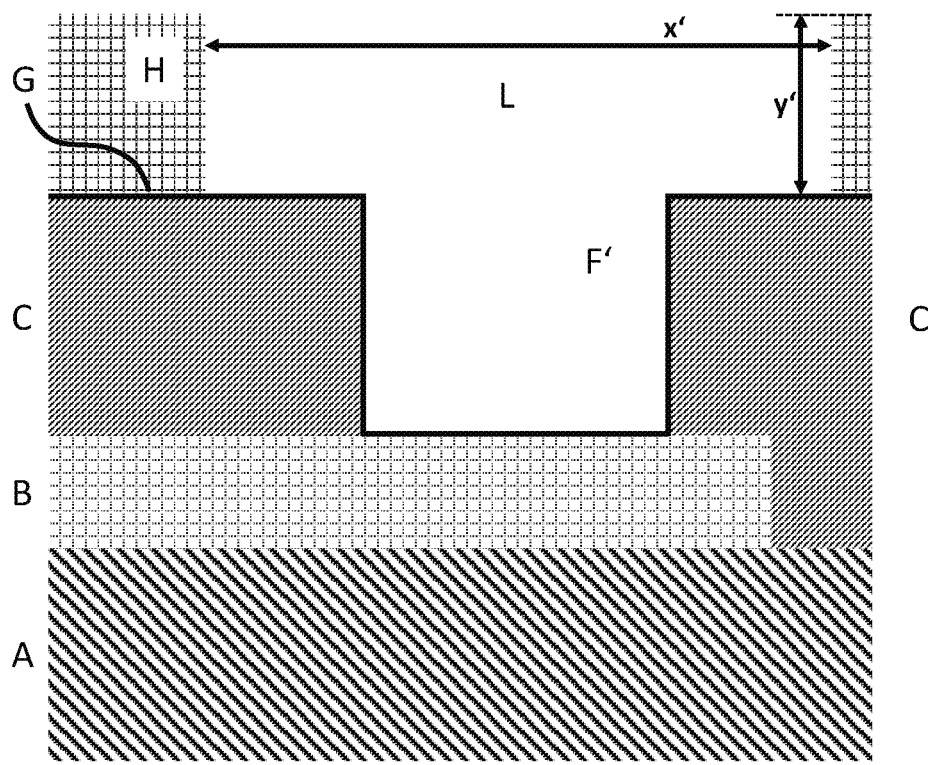
Figure 1D:
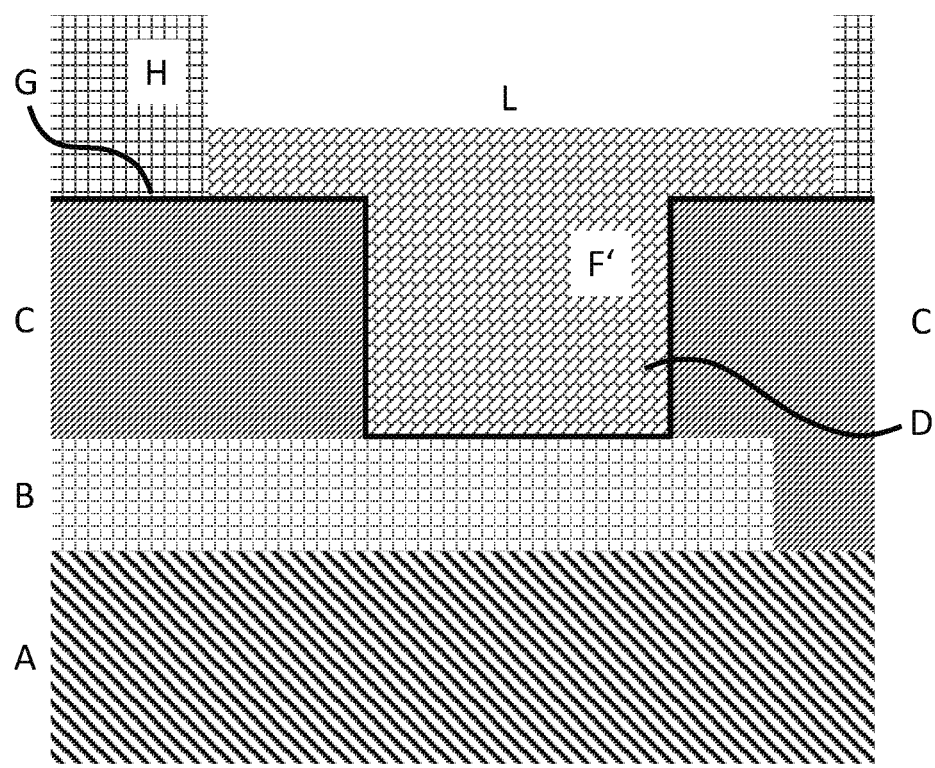
Figure 1E:
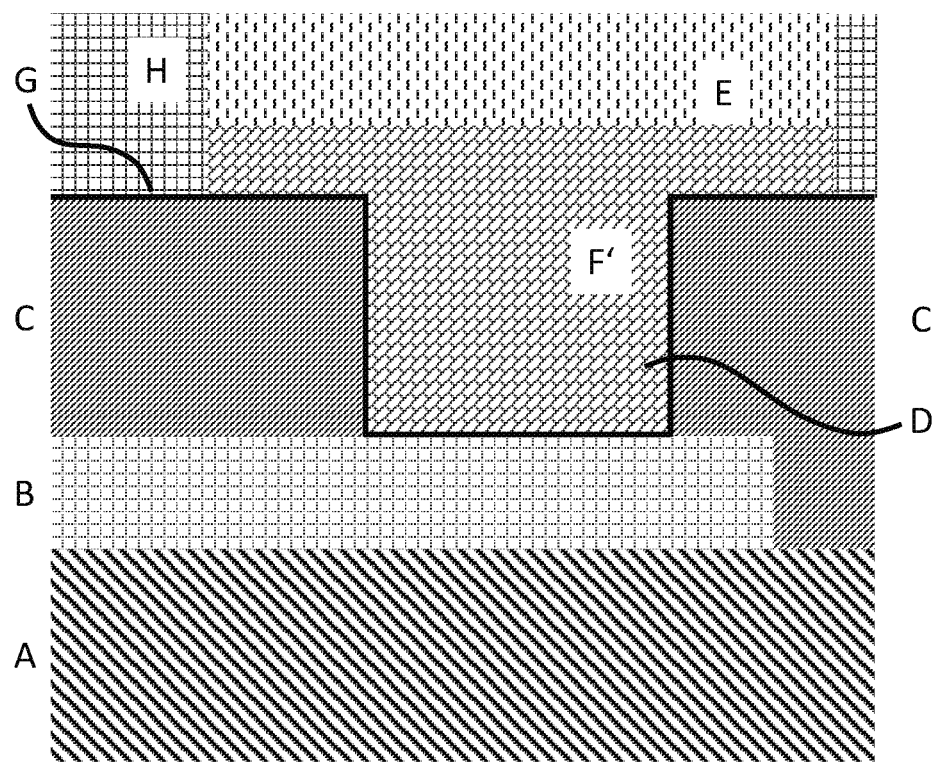
Figure 1F:
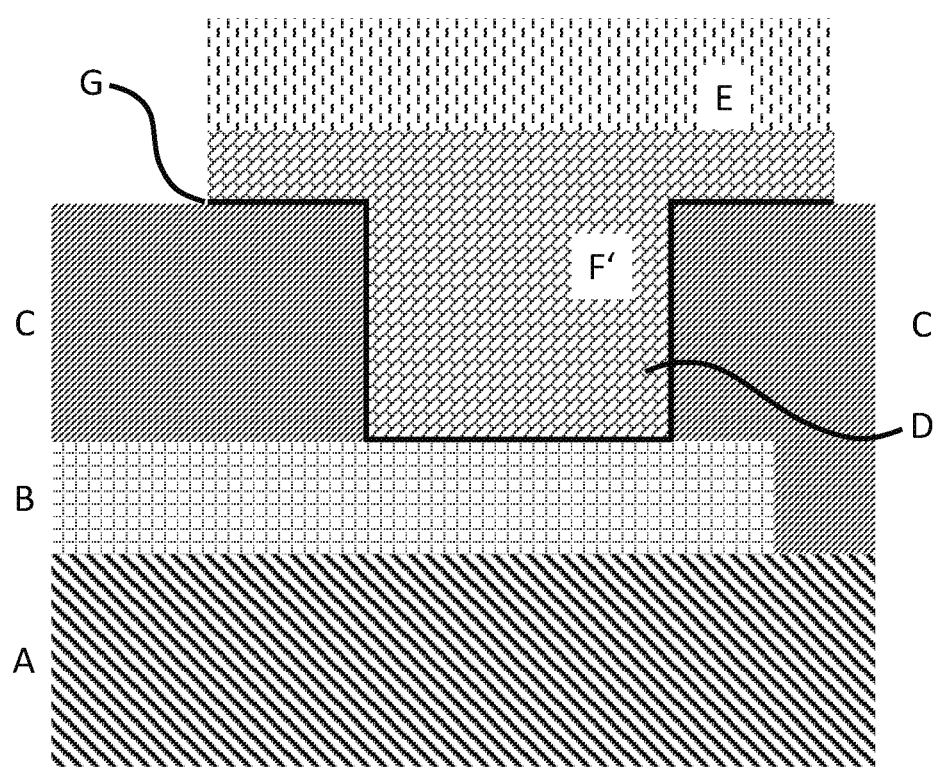
Figure 2:
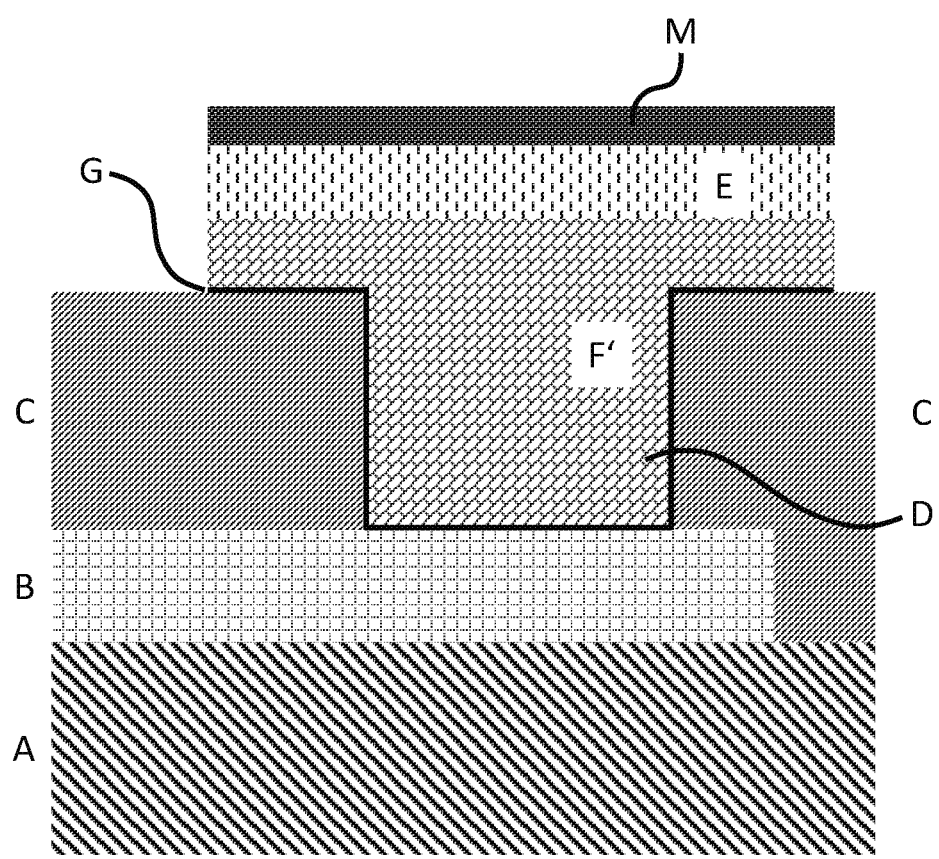

The method of the present invention is explained in more detail by means of the figures. In the figures reference signs have the following meaning:

A organic, non-conductive substrate
B contact pad as part of a circuitry
C first non-conductive resist layer
D nickel or nickel alloy
E tin or tin alloy
F opening of the first non-conductive resist layer
F' activated opening (includes conductive layer G", see below)
G conductive layer forming the activated surface (including the conductive layer outside the activated opening (G') and inside the activated opening (G"))
H second non-conductive resist layer
L extended activated opening (including the activated opening F')
M silver
x maximum width of the activated opening
y maximum depth of the activated opening
x' maximum width of the opening in the second non-conductive resist layer
y' maximum depth of the opening in the second non-conductive resist layer FIGS. 1 and 2 are schematic cross-sections.

In FIG. 1a the organic, non-conductive substrate A is depicted which exposes contact pad B under opening F of first non-conductive resist layer C. FIG. 1a corresponds to step (i) of the method of the present invention.

FIG. 1b additionally shows conductive layer G, which is deposited outside (G') and inside (G") of the opening F such that an activated surface results (i.e. the conductive layer forms the activated surface). Exhibiting the conductive layer G" opening F turns into activated opening F'. The volume of activated opening F' is generally determined by its maximum width x and its maximum depth y. FIG. 1b corresponds to step (ii) of the method of the present invention.

FIG. 1c additionally shows outside of the activated opening F' a second non-conductive resist layer H, which is patterned, formed onto the activated surface such that an extended activated opening L (including activated opening F') results. The extended activated opening is activated because it includes G" of activated opening F' and at least partly G'. The volume of the extended activated opening is determined by the volume of the activated opening F' and an additional volume formed by an opening in the second non-conductive resist layer H located above the activated opening F'. The additional volume is generally determined by the maximum width x' and maximum depth y' of the opening in the second non-conductive resist layer.

Thus, a method of the present invention (as described above, preferably as described as being preferred) is preferred additionally comprising after step (ii) but prior to step (iii)

(iia) forming outside of the activated opening a second non-conductive resist layer, which is patterned, onto the activated surface such that an extended activated opening results.

A variety of such resist layers can be used in the method of the present invention. Preferred is a method of the present invention (as described above, preferably as described as being preferred), wherein the second non-conductive resist layer comprises an acrylate polymer and/or polymethylpentene, preferably the second non-conductive resist layer comprises one or more than one compound selected from the group consisting of ethylene/ethylacrylate copolymer, ethylene/methacrylate copolymer, ethylene/acrylic acid copolymer, ethylene/butylacrylate copolymer, polymethylpentene, and polymethylmethacrylate. The above mentioned second non-conductive resist layer is preferably a resin, which is applied as a dry film.

As mentioned above, the second non-conductive resist layer is patterned, preferably patterned by at least one patterning method selected from the group consisting of laser drilling, plasma etching, spark erosion and mechanical drilling.

FIG. 1d additionally shows inside the activated opening F' electrolytically deposited nickel D (or nickel alloy D), which is deposited onto the activated surface formed by conductive layer G. FIG. 1d corresponds to step (iii) of the method of the present invention, wherein the deposition of nickel results in an entirely filled activated opening F', and wherein the entirely filled activated opening F' is completely filled with said nickel. Furthermore, nickel is also significantly deposited onto the conductive layer outside the activated opening F', wherein the thickness of deposited nickel onto the conductive layer outside the activated opening is less than the thickness of deposited nickel inside the activated opening. The thickness of deposited nickel inside the activated opening corresponds to y (see FIG. 1b).

FIG. 1e additionally shows tin E, electrolytically deposited onto electrolytically deposited nickel D. FIG. 1e corresponds to step (iv) of the method of the present invention.

FIG. 1f additionally shows that the second non-conductive resist layer H and the part of the conductive layer underneath are removed (stripped).

Thus, a method of the present invention (as described above, preferably as described as being preferred) is preferred additionally comprising after step (iv) step (v) stripping the second non-conductive resist layer and the part of the conductive layer underneath.

This means that a method of the present invention (as described above, preferably as described as being preferred) is preferred, wherein the second non-conductive resist layer, which is patterned, is a temporary resist layer, preferably a temporary photo resist. "Temporary" denotes that a stripping (removal) of the entire second non-conductive resist layer is intended. It is in particular preferred that after the solderable solder deposit has been formed the second non-conductive resist layer is stripped (removed).

The second non-conductive resist layer (as described above) is stripped from the conductive layer by contacting the second non-conductive resist layer with a solvent or a mixture of solvents Thereby, the first non-conductive resist layer is not damaged or harmed.

The solvent is preferably selected from the group consisting of benzyl alcohol, formic acid, dimethylacetamide, dimethylformamide, cyclohexanone, ethanolamine, triethanolamine, ethyleneglycol monobutylether acetate, ethyleneglycol monoethylether, and mixtures thereof. In some cases it is preferred that the above mentioned solvents additionally comprise water.

In order to strip the second non-conductive resist layer, said layer is preferably contacted with one of the above mentioned solvents or a mixture thereof by spraying or dipping. The solvent or mixture of solvents preferably exhibits a temperature in the range of 5° C. to 100° C., more preferably 10° C. to 90° C., and most preferably 15° C. to 80° C. The contact time is preferably in the range of 1 second to 600 seconds, more preferably from 10 seconds to 540 seconds, most preferably from 20 seconds to 480 seconds.

In order to remove the conductive layer underneath the second non-conductive resist layer, suitable stripping solutions are known in the art (see also examples below).

In FIG. 2 a solderable solder deposit formed according to the method of the present invention is depicted (as described through FIGS. 1a to 1f) with the only difference that a silver layer M is additionally deposited onto electrolytically deposited tin E.

In the method of the present invention (as described above) it is an essential feature that the entirely filled activated opening is completely filled with said nickel/nickel alloy, or in the entirely filled activated opening the total volume of nickel/nickel alloy is higher than the total volume of tin and tin alloy, based on the total volume of the entirely filled activated opening. This means that electrolytically depositing nickel/nickel alloy according to step (iii) is an electrolytically filling with nickel/nickel alloy. This additionally means that more than a thin layer of nickel/nickel alloy is deposited onto the activated surface within the activated opening. Preferred is a method of the present invention (as described above, preferably as described as being preferred), wherein the entirely filled activated opening is completely filled with said nickel/nickel alloy or in the entirely filled activated opening the total volume of nickel/nickel alloy is twice or more the total volume of tin and tin alloy, based on the total volume of the entirely filled activated opening, preferably is threefold or more, more preferably fivefold or more, most preferably tenfold or more. Most preferably, the activated opening is completely filled with nickel/nickel alloy.

According to our own experiments, the method of the present invention (as described above) results in solderable solder deposits that exhibit a significantly low copper content after melting the solder deposit. The method of the present invention significantly prevents copper ion migration from a copper containing conductive layer into the solder deposit because the activated opening is completely filled with nickel/nickel alloy or in the entirely filled activated opening the total volume of nickel/nickel alloy is higher than the total volume of tin and tin alloy, based on the total volume of the entirely filled activated opening. According to our own experiments, copper ions released from the conductive layer do not migrate into the electrolytically deposited nickel/nickel alloy. This effect is even more significant if nickel/nickel alloy is significantly deposited onto the conductive layer inside and outside the activated opening F' (see FIG. 1f). In the latter case, the conductive layer is not at all in contact with the deposited tin/tin alloy.

Our own experiments have also shown that at the same time the internal stiffness of the solderable solder deposit is significantly increased compared to a solderable solder deposit, which almost entirely consists of tin. It is believed that both effects (prevention of copper ion migration and internal stiffness) can be attributed to the significantly increased volume of nickel/nickel alloy in the solder deposit underneath the deposited tin/tin alloy.

Furthermore, according to our own experiments solder deposits formed according to the method of the present invention exhibit an improved dimensional stability upon heat and/or pressure. It is assumed that again the increased volume of nickel/nickel alloy underneath the deposited tin/tin alloy results in this improved dimensional stability. This is already observed upon melting the solder deposit. Compared to solder deposits consisting for example of pure tin, the solder deposit obtained according to the method of the present invention better maintains its shape and dimensions upon melting. This is in particular beneficial if the pitch between two openings (distance between the center of the opening to the center of an adjacent opening) is comparatively small. Thus, a method of the present invention (as described above, preferably as described as being preferred) is preferred, wherein the pitch is 250 µm or less, preferably 200 µm or less, more preferably 150 µm or less, even more preferably 100 µm or less, most preferably 60 µm or less.

Additionally, the method of the present invention results in solderable solder deposits that are preferably directly soldered. "Directly" denotes that a pre-melting or pre-heating of the solderable solder deposit is not necessary prior to interconnecting. According to our own experiments this leads to more reliable and stronger interconnections.

Thus, the electrolytically deposited nickel/nickel alloy in the solderable solder deposit formed according to the method of the present invention functions as an efficient copper ion barrier and at the same time increases internal stiffness as well as dimensional stability.

The method of the present invention is described for a solderable solder deposit on a contact pad under an opening of a first non-conductive resist layer. However, preferably the method of the present invention described throughout the present text includes a plurality of solderable solder deposits on a respective plurality of contact pads under a plurality of openings in the first non-conductive resist layer of the organic, non-conductive substrate. Thus, features mentioned above and below likewise refer to such a plurality of solderable solder deposits.

The contact pad is typically part of a circuitry, wherein the circuitry is located on and attached to the organic, non-conductive substrate. Typically, the circuitry is a patterned metal deposit on the organic, non-conductive substrate.

Preferably, the contact pad is a copper pad, preferably as part of a copper circuitry.

In step (i) of the method of the present invention an organic, non-conductive substrate is provided or manufactured which exposes said contact pad under an opening of a first non-conductive resist layer. This means that the organic, non-conductive substrate comprises said contact pad under the opening of the first non-conductive resist layer. Exposing includes that it is accessible by means of the opening, or in other words, lays bare by means of the opening. This is necessary for e.g. subsequent metallization processes. Usually, the opening lays bare most of the surface of the contact pad; however in many cases the opening does not lay bare the entire surface of the contact pad (compare FIG. 1). This means that in such cases the edges of the contact pad are still protected by the first non-conductive resist layer.

Preferred is a method of the present invention (as described above, preferably as described as being preferred), wherein the organic, non-conductive substrate comprises at least one resin, preferably selected from the group consisting of epoxy, polyimide, bismaleimide, cyanate ester, and benzocyclobutene. Preferably, the organic, non-conductive substrate (preferably as described before) is structurally reinforced. More preferably the structurally reinforced organic, non-conductive substrate is a fibre-reinforced, organic, non-conductive substrate and/or a particle-reinforced, organic, non-conductive substrate. Most preferred is a method of the present invention (as described above, preferably as described as being preferred), wherein the organic, non-conductive substrate is a circuit board, preferably a printed circuit board.

Preferred is a method of the present invention (as described above, preferably as described as being preferred), wherein the first non-conductive resist layer is a permanent first non-conductive resist layer, preferably a permanent solder mask. Thus, the first non-conductive resist layer (preferably as described before) according to step (i) is preferably a fully polymerized first non-conductive resist layer. Preferably, the first non-conductive resist layer is selected from the group consisting of UV-polymerizing resist layers, thermal polymerizing resist layers, photo imageable resist layers, and UV-thermal-polymerizing resist layers. Most preferably, the first non-conductive resist layer comprises cross-linked epoxy compounds.

The term "permanent" denotes that a removal of the first non-conductive resist layer and solder mask, respectively, is not intended while the method of the present invention is carried out or after the method is completed. Thus, the first non-conductive resist layer is not a temporary layer but most preferably stays for the entire life time of the organic, non-conductive substrate.

Preferred is a method of the present invention (as described above, preferably as described as being preferred), wherein the first non-conductive resist layer exhibiting the opening has a layer thickness of 200 µm or less, preferably 100 µm or less, more preferably 50 µm or less, even more preferably 35 µm or less, most preferably 20 µm or less, even most preferably 15 µm or less.

The opening in the first non-conductive resist layer is typically the result of a patterning process. For example, in a first step the first non-conductive resist layer is pre-formed without an opening and in a subsequent second step pre-polymerized and patterned. Patterning is for example achieved by photo structuring. After patterning, a patterned (with at least one opening), pre-polymerized first non-conductive resist layer is obtained, which is usually fully polymerized afterwards in a third step. In all circumstances an opening in the first non-conductive resist layer results, which exhibits a certain maximum width "x" (see FIG. 1b). Preferred is a method of the present invention (as described above, preferably as described as being preferred), wherein the maximum width of the opening in step (i) is 1000 µm or less, preferably 500 µm or less, more preferably 200 µm or less, most preferably 50 µm or less, even most preferably 30 µm or less. Preferably, the opening is a circular opening. In such a case, the maximum diameter of the opening in step (i) is preferably 1000 µm or less, preferably 500 µm or less, more preferably 200 µm or less, most preferably 50 µm or less, even most preferably 30 µm or less. A maximum diameter is present if the circular opening has a conic shape, resulting in a maximum diameter and a minimum diameter. If the shape of the circular opening is cylindrical the maximum diameter is the only diameter of the circular opening.

A method of the present invention (as described above, preferably as described as being preferred) is in particular preferred, wherein (a) the maximum width of the opening in step (i) is 50 µm or less, preferably 30 µm or less, and wherein (b) the first non-conductive resist layer exhibiting the opening has a layer thickness of 40 µm or less, preferably 30 µm or less, more preferably 25 µm or less, even more preferably 20 µm or less, most preferably 15 µm or less. According to our own experiments, solderable solder deposits for openings with such dimensions exhibit a very low amount of copper after melting the solder deposit and furthermore exhibit an excellent dimensional stability and internal stiffness.

More preferred is a method of the present invention (as described above, preferably as described as being preferred), wherein in step (i) said organic, non-conductive substrate exposes said contact pad under said opening and additionally exposes a plurality of additional contact pads under openings. Preferably all openings independently have a maximum width in the ranges defined above. In modern day applications, the maximum width of all openings is typically not identical. This means that a method of the present invention (as described above, preferably as described as being preferred) is preferred, wherein in step (i) the organic, non-conductive substrate exposes a number of first contact pads with openings having a first maximum width and at least a number of seconds contact pads with openings having a second maximum width which is different from the first maximum width. Preferably, the first and second maximum width is independently from each other and as defined above and different from each other. Most preferably, the first and second maximum width is independently from each other 200 µm or less, wherein additionally the first or second maximum width is in the range from 5 µm to 80 µm, preferably in the range from 5 µm to 40 µm, more preferably in the range from 5 µm to 15 µm. For example, the first maximum width is in the range from 100 µm to 200 µm, wherein the second maximum width is 10 µm. The method of the present invention is capable to deposit nickel or a nickel alloy into each of these openings in a single step (i.e. in step (iii) of the method of the present invention). Preferably, features throughout the present text in connection with the method of the present invention refer likewise to said plurality of contact pads (if applicable).

In step (ii) of the method of the present invention (the method as described above, preferably as described as being preferred) a conductive layer (also sometimes referred to as seed layer) is deposited inside and outside the opening such that an activated surface results, thereby forming an activated opening.

The conductive layer is needed to activate the first non-conductive resist layer such that the activated surface results. This step is necessary for subsequent electrolytic metal deposition, which means that the first non-conductive resist layer is made conductive to get access to an electrical current which is sufficient for electrolytic metal deposition. Furthermore, the conductive layer provides adhesion towards the underlying non-conductive resist layer.

Preferably, the conductive layer is deposited over the entire organic, non-conductive substrate. As a result, the conductive layer is not only deposited onto the first non-conductive resist layer but also onto the contact pad. Therefore it is preferred that each inner surface within the opening of the first non-conductive resist layer (including the contact pad) is deposited (i.e. coated) with the conductive layer.

Preferred is a method of the present invention (as described above, preferably as described as being preferred), wherein the conductive layer is deposited by wet chemical electroless deposition or vapour deposition. The conductive layer is either a single layer, a double-layer or a multi-layer, preferably a single layer. This means that it is preferred that the conductive layer is not a double-layer or a multi-layer.

Preferred is a method of the present invention (as described above, preferably as described as being preferred), wherein the conductive layer comprises
- one or more than one conductive organic polymer and/or
- one or more than one conductive element, preferably selected from the group consisting of carbon, copper, palladium, tin, cobalt, tungsten, chromium, nickel, silver, and titanium,
- most preferably the conductive layer comprises copper or is a copper layer.

Preferably, among aforementioned conductive elements carbon is utilized as carbon particles and palladium as colloidal palladium.

In some cases it is preferred that nickel and tin is not among the list of preferred conductive elements. This likewise means that it is in some cases preferred that the conductive layer explicitly does not comprise nickel, preferably does not comprise nickel and tin.

In the art several processes are known in order to obtain an activated surface. Some examples are given hereafter:

EP 0 616 053 A1 discloses a process for applying a metal coating to a non-conductive substrate comprising:
a. contacting said substrate with an activator comprising a noble metal/Group IVA metal sol to obtain a treated substrate;
b. contacting said treated substrate with a self-accelerating and replenishing immersion metal composition having a pH above 11 to pH 13 comprising a solution of:
  (i) a Cu(II), Ag, Au or Ni soluble metal salt or mixtures thereof,
  (ii) a Group IA metal hydroxide,
  (iii) a complexing agent comprising an organic material having a cumulative formation constant log K of from 0.73 to 21.95 for an ion of the metal of said metal salt.

This process results in a thin conductive layer which can be used for subsequent electrolytic metal deposition. This process is known in the art as "Connect" process.

U.S. Pat. No. 5,503,877 A discloses the formation of a conductive layer on a non-conductive substrate by means of complex compounds in order to generate metal seeds on the substrate. These metal seeds provide sufficient conductivity for subsequent electrolytic metal deposition. This process is known in the art as "Neoganth" process.

U.S. Pat. No. 5,693,209 A discloses the formation of a conductive layer by means of conductive pyrrole polymers. The process is known in the art as "Compact CP" process.

In some cases preferred is a method of the present invention (as described above, preferably as described as being preferred), wherein the conductive layer is deposited in step (ii) by utilizing colloidal palladium or an ionogenic palladium ion containing solution. Respective methods are described, for example, in "Handbuch der Leiterplattentechnik", Vol. 4, 2003, pages 307 to 311.

Preferred is a method of the present invention (as described above, preferably as described as being preferred), wherein the conductive layer has a layer thickness in the range of 200 nm to 2500 nm, preferably in the range of 300 nm to 2000 nm, more preferably in the range of 350 nm to 1500 nm, even more preferably in the range of 400 nm to 1200 nm, most preferably in the range of 500 nm to 1000 nm. Our own experiments have shown that due to the deposited nickel/nickel alloy in the solderable solder deposit copper ion migration into the solder deposit from a copper containing conductive layer is efficiently suppressed or even prevented upon melting. This is very beneficial if the overall dimensions of the solderable solder deposit are very small (e.g. 50 µm or less in diameter and 40 µm or less in height). Usually, to sufficiently suppress copper ion migration into solder deposits with such dimensions and basically only comprising tin, a copper containing conductive layer must be very thin (for example 100 to 150 nm) to effectively prevent copper ion migration from the conductive layer into the solder deposit. However, such thin conductive layers are difficult or even impossible to realize and constantly bear the danger to be incomplete. One advantage of the method of the present invention is that the layer thickness of the copper containing conductive layer can be significantly thicker, compared to a method leading to solder deposits, which basically only comprise tin. A thicker copper containing conductive layer increases the reliability and stability of the conductive layer and increases adhesion towards the underlying first non-conductive resist layer. Furthermore, the deposition of a conductive layer with sufficient thickness is also easier to control and respective layers are easier to manufacture.

As a result of step (ii) an activated opening F' is formed (see FIG. 1b). Throughout the present text "activated opening" denotes the opening in the first non-conductive resist layer additionally including the conductive layer (G") inside said opening.

In the method of the present invention (as described above, preferably as described as being preferred) preferably no further conductive layer is deposited except the conductive layer of step (ii), which is deposited prior to step (iii). For example, it is preferred that no additional conductive layer is deposited after step (iii).

In step (iii) of the method of the present invention nickel or a nickel alloy is electrolytically deposited into the activated opening such that nickel/nickel alloy is deposited onto the activated surface. This preferably means that this electrolytically deposited nickel/nickel alloy is adjacent to the conductive layer. Preferred is that no tin or tin alloy (preferably no metal or metal alloy at all) is deposited between the conductive layer and the electrolytically deposited nickel/nickel alloy of step (iii); more preferably the conductive layer contains no tin, and no tin or tin alloy (preferably no metal or metal alloy at all) is deposited between the conductive layer and the electrolytically deposited nickel/nickel alloy of step (iii).

In most of the cases a method of the present invention (as described above, preferably as described as being preferred) is preferred, wherein the nickel/nickel alloy deposited in step (iii) contains at least 95 weight-percent nickel, based on the total weight of the deposited nickel, preferably at least 99 weight-percent, more preferably is pure nickel. "Pure" means that contaminating elements such as sulfur and/or phosphorous can be present as impurities only, preferably in a total amount of less than 0.1 weight-percent. However, such elements are not deliberately added to the nickel. In contrast, in a few cases it is preferred that a nickel alloy is electrolytically deposited in step (iii), the alloy containing more than 50 weight percent of nickel, based on the total amount of the nickel alloy. Preferably, the nickel alloy comprises individually one or more than one alloying element, wherein the alloying element is selected from the group consisting of alloying metal and alloying non-metal. The alloying metal is preferably selected from the group consisting of iron, cobalt, tungsten, and palladium, more preferably selected from the group consisting of iron, tungsten, and cobalt, most preferably iron and tungsten. The alloying non-metal is preferably selected from the group consisting of phosphor and sulfur, preferably is phosphor. The total amount of alloying metals is less than 50 weight percent, based on the total amount of the nickel alloy. This means that in such cases nickel dominates such an alloy. Most preferably, the total amount of alloying elements is less than 50 weight percent, based on the total amount of the nickel alloy, preferably 40 weight percent or less, more preferably 29 weight percent or less, even more preferably 19 weight percent or less, most preferably 10 weight percent or less. This means that in each case of a nickel alloy, nickel dominates the nickel alloy. Own experiments have shown that alloying elements, preferably and in particular as described above, typically increase the melting temperature of the entire solderable solder deposit. This is desired because formation of an intermetallic phase is significantly slowed down and reduced. This in turn is desired because a significantly reduced intermetallic phase provides increased reliability of the solder deposit and a higher stability of joints under increased temperatures.

Throughout the present text, the term "nickel" or "nickel deposit" (as well as related terms) usually also includes nickel alloy if "nickel alloy" is not explicitly specified, preferably a nickel alloy as described above.

As mentioned above, a method of the present invention is preferred, wherein each inner surface within the opening of the first non-conductive resist layer is deposited with the conductive layer. In such a case electrolytic deposition of nickel/nickel alloy into the activated opening preferably requires adequate leveling properties in order to obtain void- and dimple-free nickel/nickel alloy deposits.

Preferred is a method of the present invention (as described above, preferably as described as being preferred), wherein in step (iii) nickel/nickel alloy is non-conformally deposited into the activated opening such that non-conformal nickel/nickel alloy is deposited onto the activated surface. This means that a method of the present invention (as described above, preferably as described as being preferred) is preferred, wherein the thickness of deposited nickel/nickel alloy onto the conductive layer outside the activated opening is less than the thickness of deposited nickel/nickel alloy inside the activated opening.

Throughout the present text, "non-conformally" is the adverb of "non-conformal". "Non-conformal" nickel/nickel alloy denotes nickel/nickel alloy which—in its deposition thickness—does not equally conform to or equally follows the contours of the activated surface on which it is deposited. Instead, the nickel/nickel alloy is deposited in varying thicknesses onto the surface in order to fill the activated opening such that eventually a leveled and even surface of the nickel/nickel alloy deposits results. Typically, leveler additives are used in a respective nickel plating bath in order to obtain such a non-conformal deposition.

Preferred is a method of the present invention (as described above, preferably as described as being preferred), wherein the nickel/nickel alloy in step (iii) is deposited through a nickel plating bath comprising nickel ions in a total amount from 1 g/L to 160 g/L, based on the total volume of the nickel plating bath, preferably 1 g/L to 70 g/L, more preferably 20 g/L to 70 g/L, most preferably 30 g/L to 60 g/L. The nickel plating bath is preferably an aqueous plating bath. A preferred source of nickel ions is a nickel salt, preferably selected from the group consisting of nickel chloride, nickel sulfate, nickel sulfamate, and nickel fluoroborate.

Preferred is a method of the present invention (as described above, preferably as described as being preferred), wherein the nickel plating bath comprises one or more than one leveler compound,
preferably selected from the group consisting of pyridine and substituted pyridine,
more preferably selected from the group of leveler compounds consisting of compounds of Formulae (I) and (II)

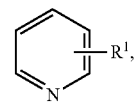

(I)

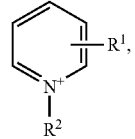

(II)

wherein
R$^1$ independently is hydrogen, substituted or unsubstituted alkyl, or substituted or unsubstituted alkenyl,
R$^2$ independently is
—(CH$_2$)$_n$—SO$_3^-$, wherein n is 1, 2, 3, 4, 5, or 6, or
—(CH$_2$)$_n$—SO$_3^-$, wherein n is 1, 2, 3, 4, 5, or 6, and one or more than one hydrogen atom in —(CH$_2$)$_n$—SO$_3^-$ is substituted by an substituent,
even more preferably selected from the group of leveler compounds consisting of compounds of Formulae (Ia) and (IIa)

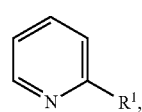

(Ia)

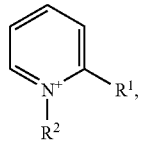

(IIa)

wherein
R$^1$ independently is
in Formula (Ia) methyl, ethyl, linear or branched propyl, or linear or branched butyl,
in Formula (IIa) —(CH$_2$)$_m$—CH=CH$_2$, wherein m is 0, 1, 2, 3, or 4, and
R$^2$ independently is (CH$_2$)$_n$—SO$_3^-$, wherein n is 1, 2, 3, or 4,
most preferably selected from the group of leveler compounds consisting of compounds of Formulae (Ib) and (IIb)

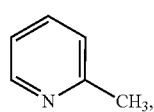

(Ib)

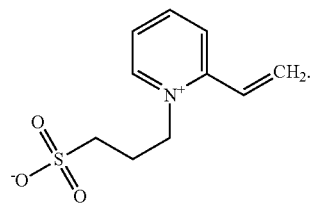
(IIb)

In some cases a method of the present invention (as described above, preferably as described as being preferred) is preferred, wherein the nickel plating bath comprises one or more than one leveler compound, preferably one or more than one of the preferred leveler compounds as described above (including the more preferred, even more preferred and most preferred leveler compounds), but with the proviso that the nickel plating bath does not contain pyridine. "Not contain" means that the compound is not present at all or only in such tiny amounts that the properties of the nickel plating bath are not affected; thus, pyridine is not intentionally added to the bath.

Preferred is a method of the present invention with the proviso that $R^1$ in Formula (I) is substituted or unsubstituted alkyl, or substituted or unsubstituted alkenyl (i.e. not including hydrogen).

In compounds of Formulae (I) and (II) it is preferred that $R^1$ is in ortho or meta position, preferably in ortho position. This means that $R^1$ is most preferably attached to a ring carbon atom next to the nitrogen atom.

In $R^1$ of compounds of Formulae (I) and (II) substituted or unsubstituted alkyl preferably is an alkyl comprising in total 1 to 8 carbon atoms, more preferably 1 to 6 carbon atoms, even more preferably 1 to 4 carbon atoms.

In $R^1$ of compounds of Formulae (I) and (II) substituted or unsubstituted alkenyl preferably is an alkenyl comprising in total 1 to 8 carbon atoms, more preferably 1 to 6 carbon atoms, even more preferably 1 to 4 carbon atoms.

In compounds of Formulae (I) and (II) substituents of substituted alkyl and substituted alkenyl in $R^1$ are independently and preferably selected from the group consisting of C1 to C4 alkyl, hydroxyl, and halogen, preferably hydroxyl and halogen.

In compounds of Formula (II) the substituent in $R^2$ is independently and preferably selected from the group consisting of C1 to C4 alkyl, hydroxyl, sulfhydryl and halogen, more preferably is hydroxyl. Preferably a single hydrogen atom is substituted by hydroxyl.

In compounds of Formulae (I) and (II) $R^1$ independently and preferably is (most preferably in ortho position)
in Formula (I) methyl, ethyl, linear or branched propyl, or linear or branched butyl,
in Formula (II) —$(CH_2)_m$—CH=$CH_2$, wherein m is 0,1, 2, 3, or 4, preferably m is 0, 1, or 2, more preferably m is 0.

In compounds of Formulae (II), (IIa), and (IIb) $R^2$ is attached to the ring nitrogen atom. As a result, compounds of these formulae are positively charged.

According to our own experiments, a nickel plating bath containing one or more than one of the above mentioned leveler compounds utilized in the method of the present invention results in excellent leveling properties for nickel/nickel alloy which is electrolytically deposited in step (iii). Thus, in many cases an excellent non-conformal nickel/nickel alloy deposit with an excellent leveled and even surface was obtained. According to our own experiments, these nickel/nickel alloy deposits were basically always without dimples and voids. Furthermore, above mentioned levelers allow a filling of openings with various widths at the same time, i.e. in a single deposition step. This is very beneficial in a manufacturing process in terms of costs and time. Thus, a method of the present invention is preferred (as described above, preferably as described as being preferred), wherein in step (iii) nickel/nickel alloy is deposited in each activated opening. In each case, nickel/nickel alloy is non-conformally deposited, i.e. a filling is carried out.

Preferred is a method of the present invention (as described above, preferably as described as being preferred), wherein the total amount of leveler compounds in the nickel plating bath is in the range of 1 mg/L to 10000 mg/L, based on the total volume of the nickel plating bath, more preferably 10 mg/L to 1000 mg/L, most preferably 100 mg/L to 900 mg/L. Preferably no other leveler compounds are present in the nickel plating bath except leveler compounds selected from the group of compounds of Formulae (I), (II), (Ia), (IIa), (Ib), and (IIb). Preferably, the nickel plating bath contains only leveler compounds selected from Formula (Ia) and Formula (IIa) or Formula (Ib) and (IIb). Thus, a method of the present invention (as described above, preferably as described as being preferred) is preferred, wherein the nickel plating bath only contains leveler compounds selected from Formula (I) and Formula (II) and the total amount of leveler compounds of Formula (I) and Formula (II) in the nickel plating bath is in the range of 1 mg/L to 10000 mg/L, based on the total volume of the nickel plating bath, preferably 10 mg/L to 1000 mg/L, more preferably 100 mg/L to 900 mg/L. More preferred is a method of the present invention (as described above, preferably as described as being preferred), wherein the nickel plating bath only contains leveler compounds selected from Formula (Ia) and Formula (IIa) and the total amount of leveler compounds of Formula (Ia) and Formula (IIa) in the nickel plating bath is in the range of 1 mg/L to 10000 mg/L, based on the total volume of the nickel plating bath, preferably 10 mg/L to 1000 mg/L, more preferably 100 mg/L to 900 mg/L. Even more preferred is a method of the present invention (as described above, preferably as described as being preferred), wherein the nickel plating bath only contains leveler compounds selected from Formula (Ib) and Formula (IIb) and the total amount of leveler compounds of Formula (Ib) and Formula (IIb) in the nickel plating bath is in the range of 1 mg/L to 10000 mg/L, based on the total volume of the nickel plating bath, preferably 10 mg/L to 1000 mg/L, more preferably 100 mg/L to 900 mg/L.

Preferred is a method of the present invention (as described above, preferably as described as being preferred), wherein the nickel plating bath has an acidic pH, preferably a pH in the range of 1 to 6, preferably 2 to 5, more preferably 3 to 5. Preferred acids in the nickel plating bath are selected from the group consisting of boric acid, phosphoric acid, citric acid, and acetic acid.

Typically, the nickel plating bath contains a number of further compounds. Preferred is a method of the present invention (as described above, preferably as described as being preferred), wherein the nickel plating bath additionally comprises one or more than one compound selected from the group consisting of buffering compounds, brightener compounds, sources of alloying elements, and wetting compounds.

"Buffering compounds" denote a weak acid or base used to stabilize and maintain in the nickel plating bath a desired pH within the range as defined above, especially after adding an additional acid or base. Preferred buffering compounds correspond to the above mentioned preferred acids, its corresponding bases, and mixtures thereof. Preferably, the buffering compounds are selected such that a pH in the above mentioned preferred acidic pH range results. The nickel plating bath preferably contains buffering compounds in a total amount of 1 g/L to 50 g/L, based on the total volume of the nickel plating bath, preferably 10 g/L to 40 g/L.

"Brightener compounds" denote compounds that exert a brightening and accelerating effect during the electrolytic deposition of nickel/nickel deposit and are optional. Preferably, the nickel plating bath contains brightener compounds in a total amount of 0 g/L to 50 g/L, based on the total volume of the nickel plating bath, preferably 0 g/L to 10 g/L, more preferably 0 g/L to 1 g/L.

"Wetting compounds" denote compounds that reduce surface tension of the nickel plating bath and are optional. If present, a better wetting of the activated surface is realized upon contacting it with the nickel plating bath. Usually gas bubbles on the activated surface are completely avoided or the number of such bubbles is at least significantly minimized. Preferably, the nickel plating bath contains wetting compounds in a total amount of 0 g/L to 10 g/L, based on the total volume of the nickel plating bath, preferably 0 g/L to 1 g/L.

During step (iii) of the method of the present invention nickel or a nickel alloy is electrolytically deposited. Preferred is a method of the present invention (as described above, preferably as described as being preferred), wherein the nickel plating bath in step (iii) has a temperature in the range of 15° C. to 80° C., more preferably in the range of 15° C. to 60° C., even more preferably in the range of 20° C. to 60° C., most preferably in the range of 25° C. to 50° C.

In step (iii), a stirring of the nickel plating bath is optional; however, stirring is preferably carried out with a stirring speed up to 3000 rpm, preferably up to 2000 rpm, more preferably up to 1000 rpm.

Preferred is a method of the present invention (as described above, preferably as described as being preferred), wherein nickel/nickel alloy is electrolytically deposited utilizing direct current, preferably direct current with a current density in the range of 0.1 to 100 A/dm$^2$ (Ampere per square decimetre), more preferably in the range of 0.1 to 50 A/dm$^2$, even more preferably in the range of 0.3 to 25 A/dm$^2$, most preferably in the range of 0.5 to 12 A/dm$^2$, even most preferably in the range of 0.5 to 6 A/dm$^2$.

Preferred is a method of the present invention (as described above, preferably as described as being preferred), wherein in step (iii) nickel/nickel alloy is electrolytically deposited for 60 minutes or less, preferably for 30 minutes or less, more preferably for 10 minutes or less.

In step (iii) nickel/nickel alloy is electrolytically deposited into the activated opening such that nickel/nickel alloy is deposited onto the activated surface. The electrolytically deposited nickel/nickel alloy forms a deposit which is clearly distinct/distinguishable from the conductive layer.

In step (iv) of the method of the present invention tin or a tin alloy is electrolytically deposited onto the nickel/nickel alloy deposited in step (iii). Preferred is a method of the present invention (as described above, preferably as described as being preferred), wherein step (iv) is carried out directly after step (iii). This means that the electrolytically deposited tin or tin alloy of step (iv) is adjacently deposited to the electrolytically deposited nickel/nickel alloy of step (iii) and that no other deposition step is carried out after step (iii) and prior to step (iv). In contrast, a rinsing and/or cleaning step between steps (iii) and (iv) is not excluded.

In step (iv) a deposition bath is used. Preferred is a method of the present invention (as described above, preferably as described as being preferred), wherein the tin and tin alloy is electrolytically deposited through a deposition bath comprising tin ions in a total amount from 10 g/L to 100 g/L, based on the total volume of the deposition bath, more preferably from 15 g/L to 95 g/L, most preferably from 40 g/L to 60 g/L. The source of tin ions is either a tin-containing soluble anode, or, if an insoluble anode is used, a soluble tin salt. A preferred tin salt is tin methane sulfonic acid because of its high solubility in aqueous solutions.

After step (iii), preferably electrolytically deposited nickel/nickel alloy with an even and leveled surface is obtained in the extended activated opening L, preferably deposited onto the entire conductive layer within the extended activated opening L (see FIG. 1d). Such a method of the present invention is very much preferred. On such a surface tin or a tin alloy can be conformally deposited. Thus, a method of the present invention (as described above, preferably as described as being preferred) is preferred, wherein in step (iv) the tin and tin alloy, respectively, is conformally deposited onto the nickel/nickel alloy deposited in step (iii).

"Conformally" is the adverb of conformal. "Conformally" deposited tin and tin alloy denotes a deposit which—in its deposition thickness—basically equally conforms to or equally follows the contours of the nickel/nickel alloy surface on which it is deposited. As a result, an evenly distributed deposit exhibiting a basically uniform thickness of tin is obtained. For this purpose, typically no leveling compounds are required in a respective deposition bath. Thus, a method of the present invention (as described above, preferably as described as being preferred) is generally preferred, wherein the tin and tin alloy is electrolytically deposited through a deposition bath not containing a leveling compound. However, in less preferred cases the deposition bath contains one or more than one leveling compound, preferably selected from the group of ketones, alpha/beta-unsaturated carboxylic acids, and aromatic aldehydes.

In the method of the present invention (as described above, preferably as described as being preferred) the deposition bath comprising the tin ions preferably additionally comprises at least one anti-oxidizing compound and/or at least one wetting compound.

The at least one anti-oxidizing compound prevents tin ions (Sn$^{2+}$) from oxidation. Preferred anti-oxidizing compounds are selected from the group consisting of hydroquinone, catechol, hydroxyl benzoic acids, dihydroxy benzoic acids, trihydroxy benzoic acids, and substituted pyridines. Preferred substituted pyridines are selected from the group consisting of 2-amino-3-hydroxy-pyridine, 3-amino-2-hydroxy-pyridine, 2,3-dihydroxy-pyridine, 3,4-dihydroxy-pyridine, 2,5-dihydroxy-pyridine, 2,3,4-trihydroxy-pyridine, 3,4,5-trihydroxy-pyridine, 2,3-diamino-pyridine, 3,4-diamino-pyridine, 2,5-diamino-pyridine, 3-amino-4,5-dihydroxy-pyridine, 4-amino-3,5-dihydroxy-pyridine, 4-amino-2,5-dihydroxy-pyridine, 4-amino-2,3-dihydroxy-pyridine, 3,4-diamino-2-hydroxy-pyridine, 3,4-diamino-5-hydroxy-pyridine, 2,3-diamino-4-hydroxy-pyridine, 2,3-diamino-5-hydroxy-pyridine, 3,4-diamino-2-hydroxy-5,6-dimethyl-pyridine, 3,4-diamino-5-hydroxy-2,6-dimethyl-pyridine, 2,3-diamino-4-hydroxy-5,6-dimethyl-pyridine, 4-amino-2,3-dihydroxy-5,6-dimethyl-pyridine, 3-amino-4,5-dihydroxy-2,6-dimethyl-pyridine, 2,5-diamino-3,4,6-trimethyl-pyridine, 3,4-diamino-2,5,6-trimethyl-pyridine, 2,3-diamino-4,5,6-trimethyl-pyridine, 3,4,5-trihydroxy-2,6-dimethyl-pyridine, 2,3,4-trihydroxy-5,6-dimethyl-pyridine, 2,5-dihydroxy-3,4,6-trimethyl-pyridine, 3,4-dihydroxy-2,5,6-trimethyl-pyridine, 2,3-dihydroxy-4,5,6-trimethyl-pyridine, 3-amino-2-hydroxy-4,5,6-trimethyl-pyridine, and 2-amino-3-hydroxy-4,5,6-trimethyl-pyridine. Preferably, the total amount of anti-oxidizing compounds, preferably compounds as defined above as being preferred, is in the range of 0.02 mol/L to 0.3 mol/L, based on the total volume of the deposition bath, preferably in the range of 0.05 mol/L to 0.15 mol/L.

The at least one wetting compound reduces the surface tension of the deposition bath such that a better wetting of the surface of the nickel/nickel alloy deposit is obtained upon contacting it with the deposition bath. The at least one wetting compound is preferably an anionic wetting compound, more preferably selected from the group consisting of alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, aryl alkylether sulfonates, aryl sulfonates, and sulfosuccinates. Preferably, the total amount of wetting compounds in the deposition bath, preferably compounds as defined above as being preferred, is in the range of 0.0002 mol/L to 0.01 mol/L, based on the total volume of the deposition bath, preferably in the range of 0.0005 mol/L to 0.002 mol/L.

Preferred is a method of the present invention (as described above, preferably as described as being preferred), wherein the deposition bath comprising the tin ions is acidic, preferably the deposition bath exhibits a pH in the range of 0 to 3, more preferably in the range of 0 to 1. An acidic pH usually results in an increased cathodic efficiency. The deposition bath preferably comprises one or more than on acid, preferably selected from the group consisting of nitric acid, acetic acid, and alkyl sulphonic acids. A preferred alkyl sulphonic acid is methane sulfonic acid.

The total amount of acids in the deposition bath is preferably in the range of 50 g/L to 200 g/L, based on the total volume of the deposition bath, preferably 70 g/L to 120 g/L.

Electrolytic deposition of tin/tin alloy in step (iv) of the method of the present invention is carried out either utilizing direct current, pulse plating or combinations thereof, preferably utilizing direct current. Utilizing pulse plating, preferably a current density in the range of 1 to 20 A/dm$^2$ is applied. Utilizing direct current, preferably a current density in the range of 1 to 3 A/dm$^2$ is applied.

Preferred is a method of the present invention (as described above, preferably as described as being preferred), wherein in step (iv) tin/tin alloy is electrolytically deposited for 120 minutes or less, preferably for 60 minutes or less, more preferably for 20 minutes or less.

According to our own experiments, a conformal deposition of tin is less demanding compared to a non-conformal deposition of tin. Furthermore, tin alloys can reliably be deposited via conformal deposition, which is usually inadequately achieved if a non-conformal deposition is utilized. As a result, in the method of the present invention a desired tin alloy can be directly and reliably deposited onto the electrolytically deposited nickel/nickel alloy. Thus, a pure tin intermediate deposit onto the electrolytically deposited nickel/nickel alloy as a preparation for a subsequent tin alloy is not needed.

Therefore, a method of the present invention (as described above, preferably as described as being preferred) is preferred, wherein in step (iv) a tin alloy is deposited, preferably comprising one or more than one alloying metal selected from the group consisting of silver, lead, copper, bismuth, antimony, zinc, nickel, aluminium, magnesium, indium, tellurium, and gallium, preferably comprising silver. Silver as alloying metal in tin exhibits excellent properties such as decreasing the melting point and surface tension compared to pure tin. If copper is used as alloying metal, only small amounts are typically used, preferably such that in the tin alloy the total amount of copper is below 1 wt-%, based on the total weight of the tin alloy, preferably below 0.7 wt-%. Typically, the alloying metal is provided as soluble salt in the deposition bath, more preferably as a salt selected from the group consisting of nitrate, acetate, and methane sulfonate. The total amount of silver ions in the deposition bath (if present) is preferably in the range of 0.1 to 1.5 g/L, based on the total volume of the deposition bath, more preferably 0.3 g/L to 0.7 g/L, even more preferably 0.4 g/L to 0.6 g/L.

Very much preferred is a method (as described above, preferably as described as being preferred) of forming a solderable solder deposit on a contact pad (preferably a copper pad) comprising the steps of (i) providing or manufacturing an organic non-conductive substrate which exposes said contact pad under an opening of a permanent first non-conductive resist layer, (ii) depositing a conductive layer inside and outside the opening such that an activated surface results, thereby forming an activated opening, (iia) forming outside the activated opening a second non-conductive resist layer, which is patterned, onto the activated surface such that an extended activated opening results, (iii) electrolytically, non-conformally depositing nickel or a nickel alloy into the extended activated opening such that non-conformal nickel/nickel alloy is deposited onto the activated surface, (iv) electrolytically, conformally depositing tin or a tin alloy (preferably a tin alloy) onto the non-conformal nickel/nickel alloy deposited in step (iii), with the proviso that the electrolytic deposition of step (iii) results in an entirely filled activated opening being completely filled with said nickel/nickel alloy, and said nickel/nickel alloy is additionally deposited onto the activated surface outside the activated opening.

As mentioned above, non-conformal, electrolytic deposition of nickel/nickel alloy in step (iii) of the method of the present invention results in a nickel/nickel alloy deposit with an excellent leveled and even surface (basically without dimples and voids). On this nickel/nickel alloy deposit, a tin alloy can be deposited directly. In general, tin alloys are very suitable for forming an interconnection to e.g. a chip. Our own experiments have shown that additional metals or metal alloys are not necessarily required on top of the electrolytically deposited tin or tin alloy, in particular not on top of a tin alloy. Typically, a layer of gold is often deposited onto tin or a tin alloy in order to avoid oxidation of said tin/tin alloy. In contrast, the method of the present invention does not need such protection measures. If oxidation occurs, it is usually very weak and oxides can be easily removed by utilizing a soldering flux. Therefore, a method of the present invention (as described above, preferably as described as being preferred) is preferred, wherein after step (iv) no gold is deposited onto the tin or tin alloy, preferably no gold and no palladium is deposited onto the tin or tin alloy. This means that gold and palladium are not intentionally deposited onto the tin or tin alloy. Even more preferred is in many cases that no metal at all is intentionally deposited for protection onto the tin or tin alloy, preferably onto a tin alloy.

This means that the tin or tin alloy (preferably the tin alloy) is the outermost metal layer prior to soldering. Thus, the method of the present invention includes only a low number of steps and is therefore quick, at the same time very reliable and includes a low level of complexity.

In contrast, in some cases a method of the present invention (as described above, preferably as described as being preferred) is preferred, wherein in step (iv) tin is deposited and subsequently a second metal on top of the tin, preferably at least one metal selected from the group consisting of silver, lead, copper, bismuth, antimony, zinc, nickel, aluminium, magnesium, indium, tellurium, and gallium, preferably silver (see FIG. 2). In such a case, melting of the solder deposit will eventually result in a tin alloy. Preferably, the second metal does not comprise gold, more preferably does not comprise gold and palladium. If copper is used as second metal, only a very thin layer is deposited, preferably such that in the tin alloy obtained after melting, the total amount of copper is below 1 wt-%, based on the total weight of the tin alloy, preferably below 0.7 wt-%.

In some cases a method of the present invention is even preferred (as described above, preferably as described as being preferred), wherein in the entire solderable solder deposit the total volume of nickel/nickel alloy is higher than the total volume of tin and tin alloy, based on the total volume of the entire solderable solder deposit.

The present invention also relates to a printed circuit board (PCB), in particular to a printed circuit board obtained through the method of the present invention (as described above, preferably as described as being preferred).

In general, the present invention relates to a printed circuit board exposing on an activated contact pad a solderable solder deposit, the deposit being partly embedded within a permanent solder mask and having a consecutive sequence of layers starting from the activated contact pad
 (a) a nickel or nickel alloy layer,
 (b) a tin or tin alloy layer onto the nickel/nickel alloy layer,
  wherein in the portion of the solder deposit, which is embedded in the permanent solder mask, the total volume of nickel/nickel alloy is higher than the total volume of tin and tin alloy.

"Exposing on" means that the solderable solder deposit is located on the contact pad, surrounded by the permanent solder mask but not covered by it. This means that the solder deposit is accessible for soldering.

"Activated contact pad" denotes a contact pad (preferably a copper pad) which is ready/prepared for electrolytic deposition of a metal. This means that such a contact pad has access to an electrical current which is sufficient for electrolytic deposition of the metal. Preferably, a conductive layer is deposited over the solder mask and the contact pad to obtain such an activated contact pad.

"Being partly embedded" denotes that part of the solder deposit which is enclosed/surrounded by the permanent solder mask and thereby embedded within the mask. In other words, it is the part of the solder deposit, which corresponds to the solder deposit in the activated opening in the method of the present invention as described above.

Preferably, the portion of the solder deposit, which is embedded in the permanent solder mask, is completely nickel/nickel alloy.

A printed circuit board (as described above, preferably as described as being preferred) is preferred, wherein the nickel/nickel alloy in the nickel/nickel alloy layer is non-conformal nickel/nickel alloy. This means that the nickel/nickel alloy layer—in its deposition thickness—does not equally conform to or equally follows the contours of the surface on which it is deposited.

The above mentioned regarding the method of the present invention preferably applies likewise to the printed circuit board of the present invention.

The present invention is further illustrated by the following non limiting examples.

EXAMPLE

In a first step an organic, non-conductive substrate exposing several copper pads under respective circular openings of a permanent solder mask (permanent first non-conductive resist layer) was provided (as exemplarily shown in FIG. 1a). Each opening had a maximum opening diameter of approximately 40 µm. The solder mask layer thickness was approximately 20 µm.

In a second step a conductive copper layer with a layer thickness of approximately 500 nm (Printoganth TP1, Atotech) was electrolessly deposited onto the entire organic, non-conductive substrate such that inside and outside the openings a solder mask with an activated surface resulted. This included that the conductive copper layer was also deposited on each copper pad under the openings (as exemplarily shown in FIG. 1b). As a result, activated openings resulted, exhibiting electrical connectivity for subsequent electrolytic nickel deposition.

In a third step a temporary photo-imageable resist layer as second non-conductive resist layer (typically supplied by Hitachi or Dow) with a layer thickness of approximately 25 µm was formed onto the activated surface of the solder mask and was subsequently patterned such that extended activated openings resulted (as exemplarily shown in FIG. 1c).

In a fourth step the surface of the no-conductive substrate obtained after the third step was cleaned in a 35° C., acidic cleaning solution (Cupra Pro S8, Atotech) for 5 minutes.

In a fifth step pure nickel was electrolytically deposited into the extended activated openings such that nickel was deposited onto the activated surface inside and outside the activated openings (as exemplarily shown in FIG. 1d). Nickel deposition was carried out in an aqueous nickel plating bath for 20 minutes at a temperature of approximately 20° C. utilizing direct current with a current density of 3 A/dm$^2$. The nickel plating bath (base plating bath: Spherolyte, Atotech) contained nickel ions in a total amount of 30 g/L to 60 g/L, boric acid, and at least one leveler compound selected from the group of compounds of Formulae (Ia) and (IIa) in a total amount in the range of 10 mg/L to 1000 mg/L. The activated openings were completely filled with nickel and nickel was also significantly deposited onto the conductive layer outside the activated opening, wherein the thickness of deposited nickel onto the conductive layer outside the activated opening is less than the thickness of deposited nickel inside the activated opening. Eventually, an even and leveled surface of the nickel deposit was obtained, which means that nickel was non-conformally deposited.

In a sixth step pure tin was electrolytically deposited onto the electrolytically deposited nickel utilizing a tin deposition bath comprising approximately 25 g/L tin ions and 100 to 140 g/L of an organic acid (as exemplarily shown in FIG. 1e). Tin deposition was carried out for 20 minutes at a temperature of approximately 25° C. utilizing direct current with a current density of 2 A/dm$^2$.

In a seventh step the temporary, patterned photo-imageable resist layer was removed (stripped) by utilizing a first stripping solution (ResistStrip IC, Atotech; as exemplarily shown in FIG. 1f).

In an eighth step copper of the copper conductive layer exposed after stripping the temporary, patterned photo-imageable resist layer was also removed (stripped) by utilizing a second stripping solution (EcoFlash, Atotech; also exemplarily shown in also FIG. 1f).

Thus, a printed circuit board with solderable solder deposits in openings exhibiting a maximum diameter of approximately 40 μm was obtained, wherein the portion of the solder deposit, which is embedded in the permanent solder mask, is completely nickel.

In a subsequent test, the solderable solder deposits were melted at 245° C. According to this test the total amount of copper in the melted solder deposit was below 0.1 weight percent, despite a layer thickness of the conductive layer of approximately 500 nm.

Additionally, upon forming interconnections with test chips, dimensional stability was increased also compared to comparative examples based on WO 2010/046235 A1. An increased dimensional stability was already observed after the melting at 245° C. Upon melting, the solder deposit maintained its shape and dimensions more than melting solder deposits obtained according to WO'235.

Furthermore, internal stiffness was significantly higher compared to comparative examples based on WO 2010/046235 A1.

The invention claimed is:
1. A method of forming a solderable solder deposit on a contact pad (B), comprising the steps of
  (i) providing an organic, non-conductive substrate (A) which exposes a first contact pad under a first opening in a first non-conductive resist layer (C), the first opening having a first maximum width, and at least a second contact pad under at least a second opening in the first non-conductive resist layer (C), the at least second opening having a second maximum width which is different from the first maximum width,
  (ii) depositing a conductive layer (G) inside (G") and outside (G') the first opening and the at least second opening such that an activated surface results, thereby forming an activated first opening and an activated at least second opening,
  (iii) electrolytically depositing nickel (D) or a nickel alloy (D) into the activated first opening and into the activated at least second opening such that a nickel or nickel alloy is deposited onto the activated surface,
  (iv) electrolytically depositing tin (E) or a tin alloy (E) onto the nickel or nickel alloy deposited in step (iii),
with the proviso that the electrolytic deposition of steps (iii) or (iv) results in an entirely filled activated first opening and an entirely filled activated at least second opening,
wherein the entirely filled activated first opening and the entirely filled activated at least second opening are completely filled with said nickel or nickel alloy, or in the entirely filled activated first opening and the entirely filled activated at least second opening the total volume of nickel or nickel alloy is higher than the total volume of tin and tin alloy, based on the total volume of the entirely filled activated first opening and the entirely filled activated at least second opening, and
wherein the nickel or nickel alloy in step (iii) is deposited into the first opening and the at least second opening in a single step.
2. The method of claim 1, wherein the organic, non-conductive substrate is a circuit board.

3. The method of claim 1, wherein the first non-conductive resist layer exhibiting the first opening and the at least second opening has a layer thickness of 200 μm or less.
4. The method of claim 1, wherein the first maximum width in step (i) is 1000 μm or less and the second maximum width is in the range from 5 μm to 80 μm.
5. The method of claim 1, wherein the conductive layer has a layer thickness in the range of 200 nm to 2500 nm.
6. The method of claim 1, wherein in step (iii) said nickel or nickel alloy is non-conformally deposited into the activated first opening and the activated at least second opening such that non-conformal nickel or nickel alloy is deposited onto the activated surface.
7. The method of claim 1, wherein the nickel or nickel alloy in step (iii) is deposited through a nickel or nickel alloy plating bath comprising nickel ions in a total amount from 1 g/L to 160 g/L, based on the total volume of the nickel or nickel alloy plating bath.
8. The method of claim 7, wherein the nickel or nickel alloy plating bath further comprises one or more than one leveler compound-selected from the group consisting of pyridine and substituted pyridine.
9. The method of claim 1, wherein step (iv) is carried out directly after step (iii).
10. The method of claim 1, wherein in step (iv) the tin (E) or tin alloy (E), respectively, is conformally deposited onto the nickel or nickel alloy deposited in step (iii).
11. The method of claim 1, wherein in step (iv) the tin (E) or tin alloy (E) is electrolytically deposited through a deposition bath not containing a levelling compound.
12. The method of claim 1 of forming a solderable solder deposit on a contact pad, further comprising the steps of
  (iia) following step (ii) and before step (iii), forming outside the activated opening a second non-conductive resist layer, which is patterned, onto the activated surface such that an extended activated opening results,
  (iii) electrolytically, non-conformally depositing the nickel or nickel alloy into the extended activated opening such that the non-conformal nickel or nickel alloy is deposited onto the activated surface,
  (iv) electrolytically, conformally depositing the tin or tin alloy onto the non-conformal nickel or nickel alloy deposited in step (iii),
  with the proviso that the electrolytic deposition of step (iii) results in an entirely filled activated opening being completely filled with said nickel or nickel alloy, and said nickel or nickel alloy is additionally deposited onto the activated surface outside the activated opening.
13. The method of claim 1, wherein after step (iv) no gold is deposited onto the tin or tin alloy.
14. The method of claim 7, wherein the nickel or nickel alloy plating bath further comprises one or more than one leveler compound, selected from the group of leveler compounds consisting of compounds of Formula (II)

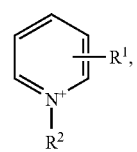

(II)

wherein
  $R^1$ independently is hydrogen, substituted or unsubstituted alkyl, or substituted or unsubstituted alkenyl, R² independently is
—(CH₂)ₙ—SO₃⁻, wherein n is 1, 2, 3, 4, 5, or 6, or
—(CH₂)ₙ—SO₃⁻, wherein n is 1, 2, 3, 4, 5, or 6, and one or more than one hydrogen atom in —(CH₂)ₙ—SO₃⁻ is substituted by a substituent.

15. The method of claim 7, wherein the nickel or nickel alloy plating bath further comprises one or more than one leveler compound, selected from the group of leveler compounds consisting of compounds of Formula (IIa)

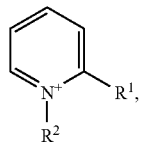

(IIa)

wherein
R¹ independently is —(CH₂)ₘ—CH=CH₂, wherein m is 0, 1, 2, 3, or 4, and

R² independently is (CH₂)ₙ—SO₃⁻, wherein n is 1, 2, 3, or 4.

16. The method of claim 7, wherein the nickel or nickel alloy plating bath further comprises one or more than one leveler compound of Formula (IIb)

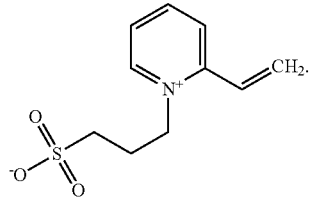

(IIb)

17. The method of claim 7, wherein the temperature of the nickel or nickel alloy plating bath is in the range from 15° C. to 50° C.

* * * * *